(12) United States Patent
Wu et al.

(10) Patent No.: US 11,004,984 B2
(45) Date of Patent: May 11, 2021

(54) LOW RESISTIVITY EPITAXIALLY FORMED CONTACT REGION FOR NANOSHEET EXTERNAL RESISTANCE REDUCTION

(71) Applicant: International Business Machines Corporation, Armonk, NY (US)

(72) Inventors: Heng Wu, Guilderland, NY (US); Oleg Gluschenkov, Tannersville, NY (US); Lan Yu, Voorheesville, NY (US); Ruilong Xie, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 45 days.

(21) Appl. No.: 16/578,762

(22) Filed: Sep. 23, 2019

(65) Prior Publication Data
US 2021/0091230 A1    Mar. 25, 2021

(51) Int. Cl.
*H01L 29/786* (2006.01)
*H01L 29/66* (2006.01)
*H01L 29/78* (2006.01)

(52) U.S. Cl.
CPC .. *H01L 29/78696* (2013.01); *H01L 29/66795* (2013.01); *H01L 29/785* (2013.01)

(58) Field of Classification Search
CPC combination set(s) only.
See application file for complete search history.

(56) References Cited

U.S. PATENT DOCUMENTS

| | | | |
|---|---|---|---|
| 8,652,944 B2 * | 2/2014 | Roca I Cabarrocas | B82Y 30/00 438/478 |
| 9,698,266 B1 * | 7/2017 | Cheng | H01L 29/7849 |
| 9,799,748 B1 | 10/2017 | Xie et al. | |
| 9,805,988 B1 * | 10/2017 | Bentley | H01L 29/78654 |
| 9,842,914 B1 | 12/2017 | Yeung et al. | |
| 9,935,012 B1 * | 4/2018 | Gao | H01L 21/31144 |
| 10,074,727 B2 | 9/2018 | Aduslimilli et al. | |
| 10,170,587 B2 | 1/2019 | Cheng et al. | |

(Continued)

OTHER PUBLICATIONS

N. von den Driesch et al., "Direct Bandgap Group IV Epitaxy on Si for Laser Applications," Chemistry of Materials: American Chemical Society, Chem. Mater. 2015, vol. 27; pp. 4693-4702.

(Continued)

*Primary Examiner* — Mamadou L Diallo
(74) *Attorney, Agent, or Firm* — Cantor Colburn LLP; Jeffrey S LaBaw

(57) ABSTRACT

Embodiments of the present invention are directed to forming a nanosheet field effect transistor (FET) having a low resistivity region that reduces the nanosheet external resistance. In a non-limiting embodiment of the invention, a nanosheet stack is formed over a substrate. An inner layer is formed over nanosheets in the nanosheet stack. The inner layer includes a first material having a first melting point. An outer layer is formed over the inner layer. The outer layer includes a second material having a second melting point that is lower than the first melting point. A heavily doped region is formed on a surface of the outer layer and the nanosheet stack is annealed at a temperature between the first melting point and the second melting point such that the outer layer is selectively liquified, distributing the dopants throughout the outer layer.

20 Claims, 16 Drawing Sheets

(56) References Cited

U.S. PATENT DOCUMENTS

| | | | |
|---|---|---|---|
| 2006/0009003 A1* | 1/2006 | Romano | H01L 29/66469 |
| | | | 438/382 |
| 2009/0176353 A1* | 7/2009 | Plummer | H01L 21/02609 |
| | | | 438/481 |
| 2010/0001259 A1* | 1/2010 | Saitho | H01L 29/78696 |
| | | | 257/24 |
| 2014/0159159 A1 | 6/2014 | Steigerwald et al. | |
| 2016/0155798 A1* | 6/2016 | Borg | H01L 21/02546 |
| | | | 257/618 |
| 2017/0033178 A1* | 2/2017 | Krishnan | H01L 29/7851 |
| 2018/0151740 A1* | 5/2018 | Wu | H01L 21/28158 |
| 2018/0204950 A1 | 7/2018 | Cheng et al. | |
| 2018/0219083 A1 | 8/2018 | Guillorn et al. | |
| 2018/0261597 A1 | 9/2018 | Adusumilli et al. | |
| 2019/0074224 A1* | 3/2019 | Xie | H01L 29/42392 |

OTHER PUBLICATIONS

Lin-Lin Wang et al., "Comprehensive study of Ga activation in Si, SiGe and Ge with 5× 10-10 Ω• cm 2 contact resistivity achieved on Ga doped Ge using nanosecond laser activation," International Electron Devices Meeting (IEDM), 2017, 22.4, 4pp.

Oleg Gluschenkov et al., "External Resistance Reduction by Nanosecond Laser Anneal in Si/SiGe CMOS Technology," International Electron Devices Meeting (IEDM), 2018, 35.3, 4 pp.

* cited by examiner

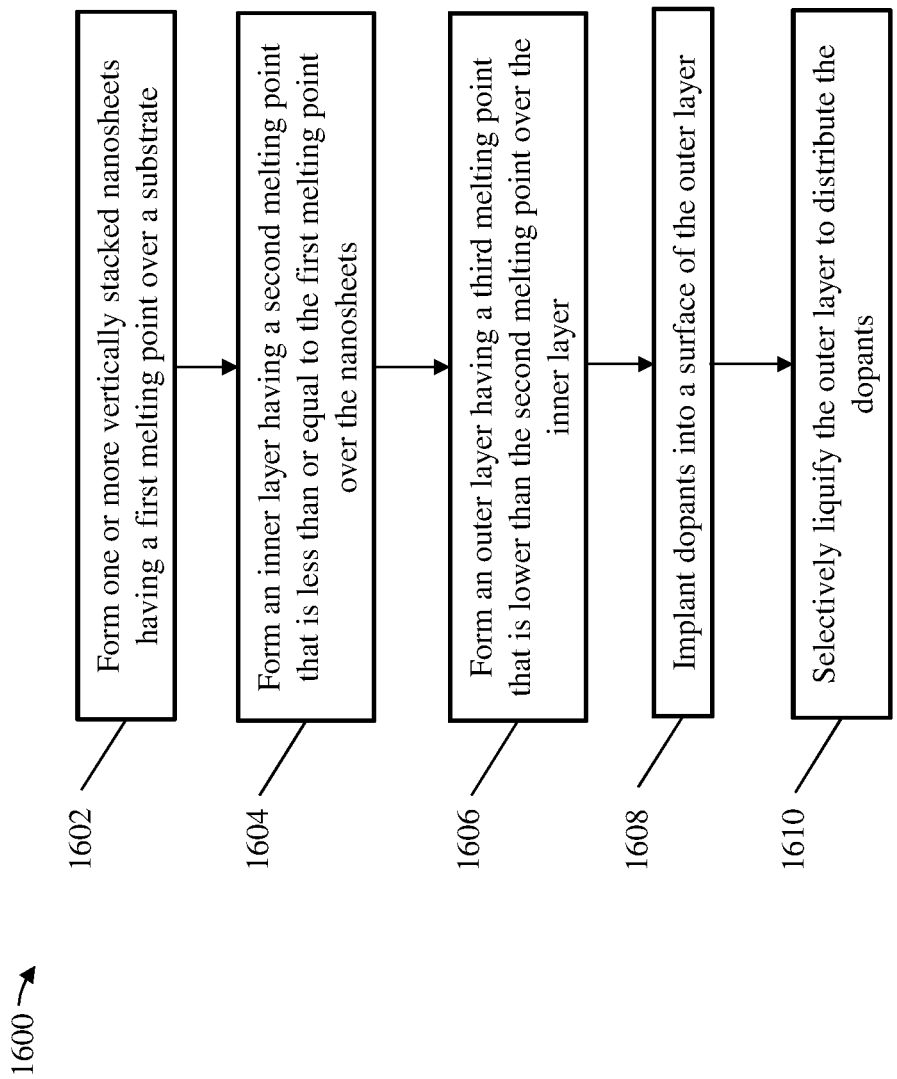

LOW RESISTIVITY EPITAXIALLY FORMED CONTACT REGION FOR NANOSHEET EXTERNAL RESISTANCE REDUCTION

BACKGROUND

The present invention generally relates to fabrication methods and resulting structures for semiconductor devices, and more specifically, to fabrication method and resulting structures for nanosheet field effect transistors (FETs) having a low resistivity epitaxially formed contact region that reduces the nanosheet external resistance.

Known metal oxide semiconductor field effect transistor (MOSFET) fabrication techniques include process flows for constructing planar FETs. A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, nanosheet FETs provide increased device density and some increased performance over lateral devices. In nanosheet FETs, in contrast to conventional FETs, the gate stack wraps around the full perimeter of each nanosheet, enabling fuller depletion in the channel region, and reducing short-channel effects due to steeper subthreshold swing (SS) and smaller drain induced barrier lowering (DIBL). The wrap-around gate structures and source/drain contacts used in nanosheet devices also enable greater management of leakage current and parasitic capacitance in the active regions, even as drive currents increase.

SUMMARY

Embodiments of the invention are directed to forming a nanosheet FET having a low resistivity epitaxy contact region that reduces the nanosheet external resistance. A non-limiting example of the method includes forming a nanosheet stack over a substrate. An inner layer is formed over nanosheets in the nanosheet stack. The inner layer includes a first material having a first melting point. An outer layer is formed over the inner layer. The outer layer includes a second material having a second melting point that is lower than the first melting point. A heavily doped region is formed on a surface of the outer layer and the nanosheet stack is annealed at a temperature between the first melting point and the second melting point such that the outer layer is selectively liquified.

Embodiments of the invention are directed to forming a nanosheet FET having a low resistivity epitaxy contact region that reduces the nanosheet external resistance. A non-limiting example of the method includes forming one or more vertically stacked nanosheets over a substrate. The nanosheets include a first material having a first melting point. An inner layer is formed over the nanosheets. The inner layer includes a second material having a second melting point that is less than or equal to the first melting point. An outer layer is formed over the inner layer. The outer layer includes a third material having a third melting point that is lower than the second melting point. Dopants are implanted into a surface of the outer layer and the nanosheet stack is selectively liquified to distribute the dopants throughout the outer layer.

Embodiments of the invention are directed to a semiconductor structure. A non-limiting example of the semiconductor device includes one or more vertically stacked nanosheets over a substrate. The nanosheets include a first material having a first melting point. An inner layer is formed over the nanosheets. The inner layer includes a second material having a second melting point that is less than or equal to the first melting point. An outer layer is formed over the inner layer. The outer layer includes dopants and a third material having a third melting point that is lower than the second melting point. The outer layer is liquified and then quenched to evenly distribute the dopants.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 16 depicts a flow diagram illustrating a method according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, in a gate all around (GAA) nanosheet structure, due to the stacked nanosheets used, the source/drain contact landing falls on top of the stacked nanosheets. As a result of this geometry, continued scaling of nanosheet FETs is limited by difficulties in achieving reductions in contact and series resistance. One approach to lower the contact resistance in a nanosheet is to replace the conventional contact with a wrap-around contact (WAC). The benefits of a WAC to a nanosheet is limited, however, because only the top region of the nanosheet stack benefits from a low resistivity.

Figure 1:
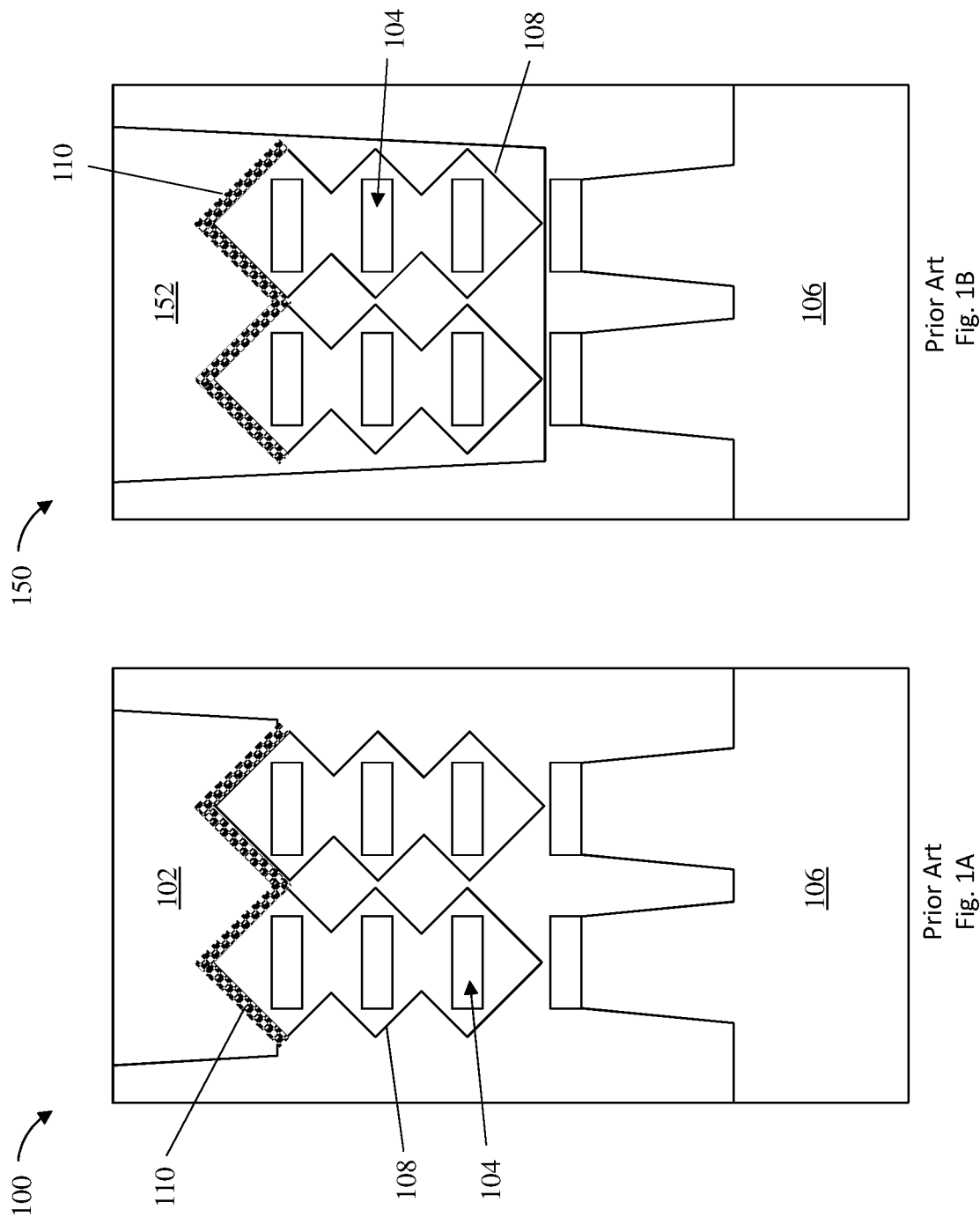
FIG. 1A depicts a cross-sectional view of a conventional semiconductor structure having a non-WAC contact and a limited low resistivity contact region.
FIG. 1B depicts a cross-sectional view of a conventional semiconductor structure having a WAC contact and a limited low resistivity contact region.

To illustrate, FIG. 1A shows a nanosheet structure 100 having a conventional contact 102. The nanosheet structure 100 further includes one or more vertically stacked nanosheets 104 formed over a substrate 106, and epitaxially grown source/drain regions 108. As further shown in FIG. 1A, the nanosheet structure 100 includes a low contact resistivity contact region 110 at the interface between the contact 102 and the heavily-doped source/drain regions 108. Due to the limited size of this interface, further reductions in contact resistance are difficult.

FIG. 1B shows a nanosheet structure 150 having a WAC 152. The nanosheet structure 150 further includes one or more vertically stacked nanosheets 104 formed over a substrate 106, and source/drain regions 108. As further shown in FIG. 1B, the nanosheet structure 150 includes a low contact resistivity contact region 110 at the interface between the WAC metal 152 and the heavily-doped source/drain regions 108 and a higher contact resistivity contact interface in other regions where the WAC metal 152 wraps around and contacts the source/drain regions 108. As discussed previously herein, the WAC 152 offers some improvement (decrease) in contact resistance due to the enlarged contact area. Any improvement is limited, however, by the somewhat restricted size of low contact resistivity contact region 110 that is formed by a line-of-sight ion implantation techniques.

Turning now to an overview of aspects of the present invention, one or more embodiments of the invention address the above-described shortcomings of the prior art by providing a new semiconductor structure and a method that reduces the contact resistivity and source/drain resistivity of a nanosheet transistor in the whole surface region of the nanosheet source/drain region. Advantageously, this new process can be applied to both WAC and non-WAC structures alike.

To achieve a reduced contact resistivity across the entire source/drain epitaxy surface, a multilayer source/drain is epitaxially grown over the nanosheet stack. In some embodiments of the invention, the nanosheet stack can include multiple nanosheets. In some embodiments of the invention, the nanosheet stack can include one nanosheet. In some embodiments of the invention, the nanosheet stack is first cut in selected regions and the multilayer source/drain is epitaxially grown over the sidewalls of the cut nanosheet stack. This multilayer source/drain can be epitaxially grown to include a main (core or inner) layer and a capping (outer) layer. Materials (e.g., germanium percentages) for the main layer, capping layer, and nanosheets can be selected to ensure that the nanosheets have a highest melting point T1, the capping layer has a lowest melting point T3, and the main layer has a melting point T2 that is greater than T3 but less than or equal to T1 (i.e., T3<T2≤T1). In some embodiments of the invention, the capping layer germanium content is kept below about 80 percent, to avoid germanium inter-diffusion during a subsequent replacement-metal-gate (RMG) process.

A shallow ion implantation is used to heavily dope a surface of the capping layer. As used herein, "heavily doped" means that the atomic concentration of the dopant can exceed $10^{21}$ cm$^{-3}$ (equivalent to approximately 2 to 3 atomic percent). In some embodiments of the invention, the dopant concentration ranges from 2 atomic percent to 40 atomic percent, for example 10 atomic percent. A nanosecond anneal is then used at a temperature tuned to melt the capping layer (including the heavily doped surface) but not the main layer. Due to the melting of the capping layer, the dopants redistribute throughout the capping layer, leading to a heavily doped capping layer. The atomic concentration of dopants in the resultant heavily doped capping layer is approximately 2 to 3 times less than the concentration of dopant in the starting surface layer but still exceeds the dopant solid solubility limit. The dopant solid solubility limit (the highest concentration of dopants that can be mixed up into solid semiconductors in a homogeneous fashion) is typically 1-2 atomic percent. Advantageously, a nanosecond-scale anneal allows for mixing up dopants with a liquid semiconductor in concentrations exceeding their respective solid solubility limits and then quenching the liquid solution on the nanosecond scale preserving a highly metastable dopant-semiconductor alloy of the heavily doped capping layer. The surface implantation and nanosecond-scale annealing can be repeated multiple times and at multiple points of the nanosheet fabrication process flow to yield a desired concentration of dopants in the heavily doped capping layer. The heavily doped capping layer defines a low resistivity region and low contact resistivity region that encompasses the whole surface of the main layer, providing a low resistivity path for electrical current and a lower contact resistivity region that is not limited to the top interface between the source/drain and the metallic contact.

Turning now to a more detailed description of aspects of the present invention, FIGS. 2 to 9 represent a non-WAC process flow for forming a low resistivity region that encompasses the whole surface of the main layer.

Figure 2:
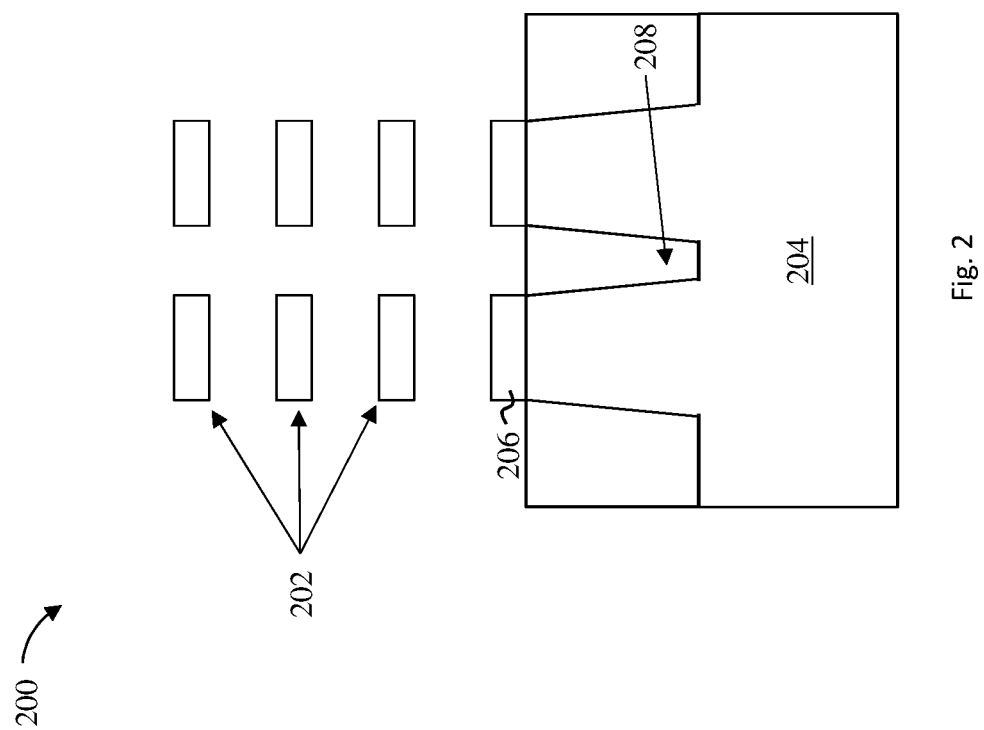
FIG. 2 depicts a cross-sectional view of a semiconductor structure after an initial set of processing operations according to one or more embodiments of the invention.

FIG. 2 depicts a cross-sectional view of a semiconductor structure 200 after an initial set of fabrication operations have been applied as part of a method of fabricating a final semiconductor device according to one or more embodiments of the invention. The final semiconductor device can be a variety of types of MOSFETs, including, for example, n-type nanosheet field effect transistors (NS NFETs) and p-type field nanosheet field effect transistors (NS PFETs). In some embodiments of the invention, the final semiconductor device can include one or more vertically stacked nanosheets 202 (collectively referred to as a nanosheet stack) formed over a substrate 204. For ease of discussion reference is made to operations performed on and to a structure having three nanosheets 202. It is understood, however, that the nanosheet stack can include any number of nanosheets. For example, the nanosheet stack can include a single nanosheet, two nanosheets, five nanosheets, eight nanosheets, or any number of nanosheets.

The substrate 204 can be made of any suitable substrate material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 204 can include a buried oxide layer (not depicted). The buried oxide layer can be made of any suitable dielectric material, such as, for example, a silicon oxide. In some embodiments of the invention, the buried oxide layer is formed to a thickness of about 20 nm, although other thicknesses are within the contemplated scope of the invention.

The nanosheets 202 can be made of any suitable material such as, for example, monocrystalline silicon, silicon germanium, III-V compound semiconductor, and II-VI compound semiconductor. In some embodiments of the invention, the nanosheets 202 are nFET nanosheets. In some embodiments of the invention, the nFET nanosheets are silicon nanosheets. In some embodiments of the invention, the nanosheets 202 are pFET nanosheets. In some embodiments of the invention, the pFET nanosheets are silicon germanium nanosheets having a germanium concentration of about 0 (pure Si) to about 25 percent (referred to as SiGe25), although other germanium concentrations are within the contemplated scope of the invention.

In some embodiments of the invention, the nanosheets 202 have a thickness of about 4 nm to about 10 nm, for example 6 nm, although other thicknesses are within the contemplated scope of the invention. In some embodiments of the invention, the vertical spacing between nanosheets 202 have a dimension suitable for wrapping a functional gate stack (gate dielectric and gate electrode) around each nanosheet. In some embodiments of the invention, the vertical spacing between nanosheets 202 have a dimension of about 7 nm to about 25 nm, for example 12 nm, although other thicknesses are within the contemplated scope of the invention. The vertical spacing between nanosheets 202 is defined by a thickness of sacrificial material disposed in between adjacent stacked nanosheets. The sacrificial dummy material can be a SiGe semiconductor with a high Ge concentration (e.g. containing 30-50% Ge) exceeding that of nanosheets 202. In some embodiments of the invention, the sacrificial material present in between nanosheets is removed selectively to nanosheets 202 during the replacement metal gate process module (RMG module) and is not shown in FIG. 2 for clarity. In some embodiments of the invention, the substrate 204 and the nanosheets 202 can be made of a same semiconductor material. In other embodiments of the invention, the substrate 204 can be made of a first semiconductor material and the nanosheets 202 can be made of a second semiconductor material. Moreover, while not shown in the cross-sectional view of FIG. 2, the nanosheets 202 are held in place and protected by a sacrificial gate (sometimes referred to as a dummy gate in RMG processes) during formation of source/drain structures.

In some embodiments of the invention, a bottom isolation structure 206 is formed between the substrate 204 and the nanosheets 202. The bottom isolation structure 206 can be made of any suitable material such as, for example, a low-k dielectric, a nitride, silicon nitride, silicon dioxide, SiON, SiC, SiOCN, or SiBCN. The bottom isolation structure 206 can be formed by disposing a dummy material, typically a SiGe semiconductor with even higher Ge content than any dummy SiGe material present in between nanosheets 202, and selectively converting such material into the isolation structure 206. The selective conversion process can include the steps of selectively removing dummy semiconducting material and refilling the formed tunnel underneath nanosheet stack 202 with a dielectric or, alternatively, a selective oxidation step that converts the dummy semiconducting material into a dielectric, e.g. silicon oxide, without affecting nanosheet stack 202 above. Accordingly, the bottom isolation structure 206 can be formed using a selective thermal oxidation, selective wet etch, selective dry etch, chemical vapor deposition (CVD), spin-on dielectric deposition with subsequent curing, plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process.

As further shown in FIG. 2, a shallow trench isolation region 208 can be formed adjacent to the nanosheets 202 and the bottom isolation structure 206. In some embodiments of the invention, a trench is formed by recessing an exposed surface of the substrate 204. The trench can then be filled with dielectric material, such as, a low-k dielectric, a nitride, silicon nitride, silicon oxide, SiON, SiC, SiOCN, or SiBCN. In some embodiments of the invention, the shallow trench isolation can be formed prior to forming nanosheet stack 202 and bottom isolation structure 206. The excess dielectric material can be removed by chemical mechanical polishing (CMP) and/or reactive ion etch (RIE). The shallow trench isolation region 208 provides electrical isolation between the nanosheets 202 and other adjacent devices (not shown) on the substrate 204.

Figure 3:
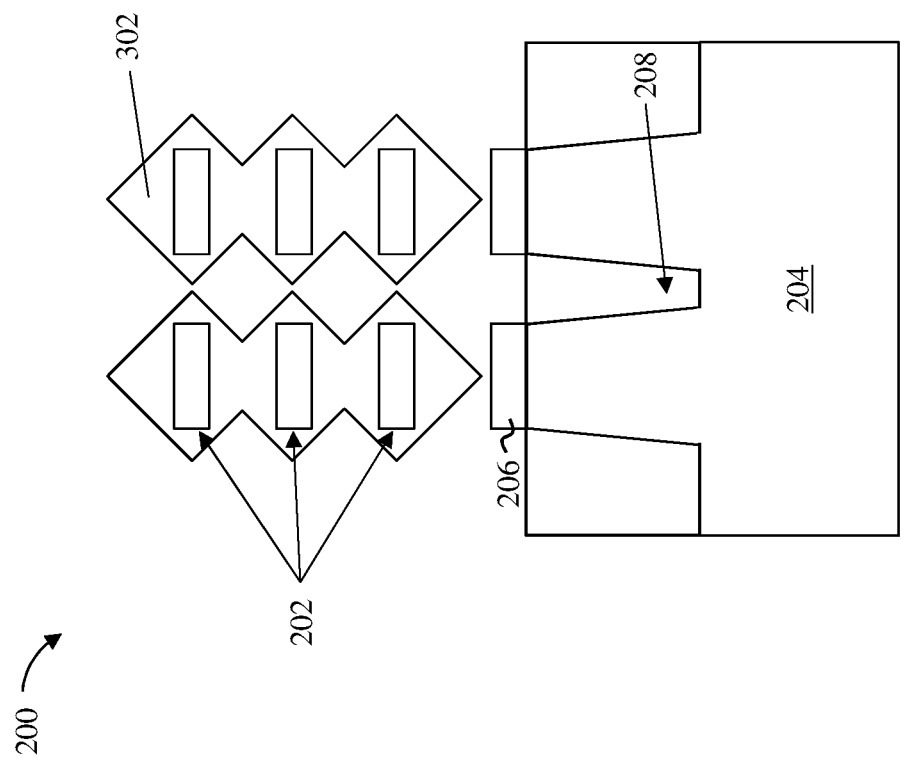
FIG. 3 depicts a cross-sectional view of the semiconductor structure after additional processing operations according to one or more embodiments of the invention.

FIG. 3 depicts a cross-sectional view of the semiconductor structure 200 after a processing operation according to one or more embodiments of the invention. In some embodiments of the invention, an inner layer 302 (source/drain region) is formed over the nanosheets 202. In some embodiments of the invention, the inner layer 302 is formed to a thickness (height) of 10 nm or more, for example 40 nm to 70 nm, although other thicknesses are within the contemplated scope of the invention. In some embodiments of the invention, the nanosheet stack is first cut in selected regions, while preserving the channel region that extends into the region shown in FIG. 3, and the inner layer 302 is epitaxially grown over the nanosheet sidewalls partially replacing removed material and providing bulk of the source/drain volume.

The inner layer 302 can be epitaxially grown on exposed surfaces of the nanosheets 202 including its sidewalls using, for example, vapor-phase epitaxy (VPE), molecular beam epitaxy (MBE), liquid-phase epitaxy (LPE), or other suitable processes. In this manner, the inner layer 302 can be conformally formed over and sideways of the nanosheets 202 abutting nanosheet channel area from both ends, thus, providing a bulk of the source/drain volume. The inner layer 302 can include semiconductor materials epitaxially grown from gaseous or liquid precursors.

In some embodiments of the invention, the gas source for the epitaxial deposition of semiconductor material includes a silicon containing gas source, a germanium containing gas source, or a combination thereof. For example, a silicon layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). For example, a carbon doped silicon can be epitaxially formed utilizing a combination of silicon gas source and carbon gas source such as methane. This Si:C layer can be grown in the same chamber used for other epitaxy steps or in a dedicated Si:C epitaxy chamber. The Si:C can include carbon in the range of about 0.2 percent to about 3.0 percent. In some embodiments of the invention, the epitaxial semiconductor materials include Group-IV tin (Sn) alloys such as SiGeSn. For example, a Group-IV tin alloy can be epitaxially formed utilizing a combination of silicon gas source, germanium gas source, and tin gas source such as tin chloride ($SnCl_4$). This SiGeSn layer can be grown in the same chamber used for other epitaxy steps or in a dedicated SiGeSn epitaxy chamber. The SiGeSn can include Sn in the range of about 1 percent to about 20 percent and up to 40 percent for GeSn alloys.

Epitaxially grown silicon and silicon germanium can be doped by adding n-type dopants (e.g., P, As, or Sb) or p-type dopants (e.g., Ga, B, $BF_2$, or Al), depending on whether the final device is an nFET or pFET nanosheet FET. The inner layer 302 can be epitaxially formed and doped by a variety of methods, such as, for example, in-situ doped epitaxy (doped during deposition), doped following the epitaxy, or by implantation and plasma doping. Importantly, all these doping techniques have limitations on the amount of dopants that can be incorporated into underlying semiconducting material. One of the chemical limits for incorporating dopants into host solid materials is a physical quantity known as the solid solubility for a particular dopant in a particular host material.

The solid solubility is a function of ambient temperature and it often peaks at somewhat below (e.g. 100-200 C below) the host material melting point. For silicon-based semiconductors, a typical maximum solubility limit is reached at around 1100-1250 C and is typically less than 2-3 atomic percent (at. %) for common dopants or, equivalently, less than $1.5 \times 10^{21}$ $cm^{-3}$. The solid solubility is lower at lower ambient temperatures such that the homogeneous incorporation of common dopants in silicon-based semiconductors does not exceed about 1 at. % or $5 \times 10^{20}$ $cm^{-3}$ at around 1000 C, for instance. In-situ doped epitaxy may be able to trap dopants in the growing host material in excess of the maximum solid solubility limit. However, such non-equilibrium incorporation of dopants into a growing host material typically does not exceed an amount equal to several maximum solubility limits for the dopant-host pair. For silicon-based semiconductors, in-situ doped epitaxy may be able to incorporate certain dopants up to several at. % (e.g. up to 4-6 at. %) or, equivalently, up to $3 \times 10^{21}$ $cm^{-3}$. Furthermore, such highly metastable material cannot be sustained at elevated temperatures for prolonged durations. For instance, holding such material at 950 C for several seconds will precipitate out the excess dopants above the dopant solubility limit at 950 C which is typically in mid-$10^{20}$ $cm^{-3}$ range. Presence of dopant precipitates and clusters in doped semiconductors is not desirable because they impede electrical conductivity acting as scattering centers while not contributing to free electrical carriers (electrons or holes). Ion implantation and plasma doping may also introduce dopants in excess of their maximum solid solubility limit but they would require a high-temperature anneal step to reform the implantation-damaged semiconductor material, to diffuse and redistribute the dopants in the implanted material, and to place dopants into lattice substitutional sites. Redistribution of implanted dopants is particularly challenging for stacked nanosheets devices because the implantation processes are limited to surface implants with suppressed lateral straggle of dopants. Lateral straggle of implanted dopants causes dopant scattering into transistor channel and degraded performance of short-channel transistors. Redistribution of surface implanted dopants may require anneals with higher thermal budgets. Such anneals will cause a precipitation of excess dopants negatively affecting electrical conductivity and an excessive lateral diffusion of dopants leading to a degraded performance of short-channel transistors. Doping and composition of the inner layer 302 is optimized for achieving a high bulk electrical conductivity while providing a required compatibility to the transistor channel, i.e. avoiding an excessive diffusion of dopants into the channel. In some embodiments of the invention, the inner layer 302 is formed prior to subjecting transistor structures to high-temperature anneals. Accordingly, the dopant concentration is selected to be below about $1\times10^{21}$ cm$^{-3}$, or between $1\times10^{20}$ cm$^{-3}$ and $1\times10^{21}$ cm$^{-3}$, in order to avoid excessive dopant precipitation and diffusion during high-temperature anneals.

In some embodiments of the invention, the nanosheets 202 are silicon nanosheets (nFETs) lightly p-type doped or undoped in the channel region and n-type doped in the source/drain regions and the inner layer 302 is made of n-type doped silicon (e.g., Si:As, Si:P, or Si:Sb). In some embodiments of the invention, the nanosheets 202 are lightly n-type doped or undoped silicon germanium nanosheets (pFETs) in the channel region and p-type doped in the source/drain regions and the inner layer 302 is made of silicon germanium having a higher germanium content than the nanosheets 202. For example, the nanosheets 202 can be made of SiGe5 or SiGe20 and the inner layer 302 can be made of SiGe15 or SiGe 40, respectively. In some embodiments of the invention, the inner layer 302 can be made of silicon germanium having a range of about 25 (SiGe25) to about 40 percent (SiGe40), although other germanium concentrations are within the contemplated scope of the invention. Forming the inner layer 302 in this manner (i.e., using highly n-type doped silicon or SiGe having a higher germanium content) will ensure that the melting point of the inner layer 302 (T2) will be less than or equal to the melting point of the nanosheets 202 (T1) (i.e., T2≤T1). In some embodiments of the invention, the inner layers 302 for respective nFET and pFET devices are grown sequentially with first blocking source/drain regions with a hard mask layer, opening and cleaning nFET source/drain regions with lithography, RIE, and cleaning steps, selectively growing nFET inner region 302, and repeating these steps for growing pFET inner region 302. The order in which nFET and pFET inner regions 302 are grown is determined by compatibility to other steps in a particular process fabrication flow.

Figure 4:
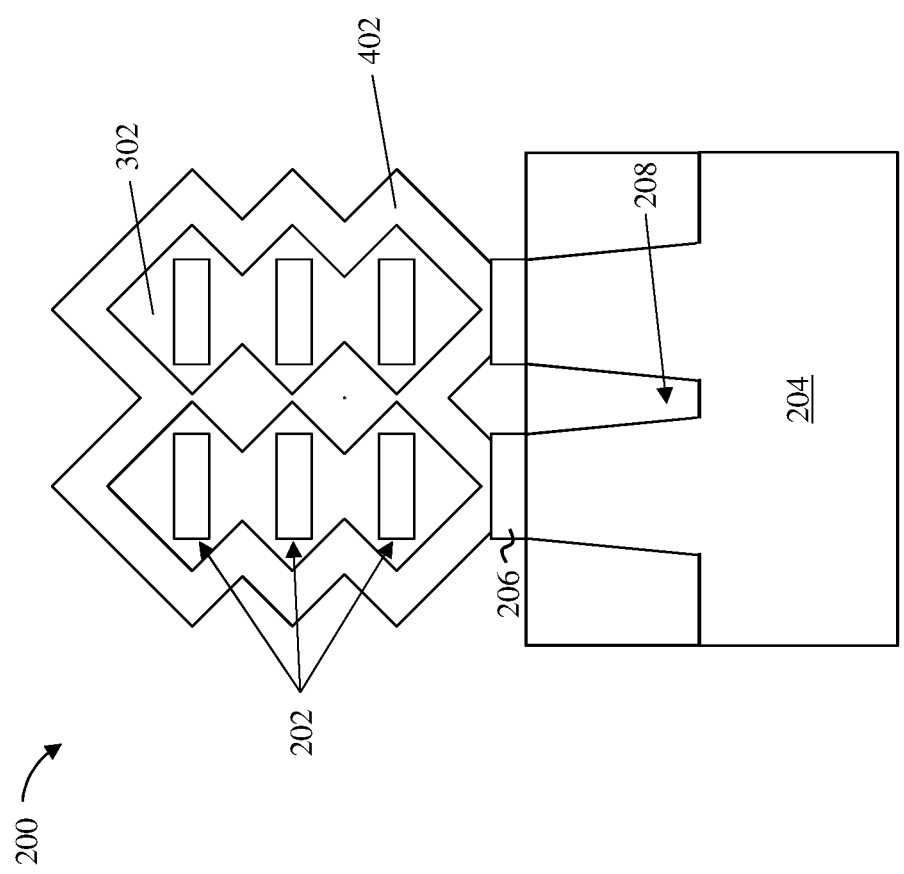
FIG. 4 depicts a cross-sectional view of the semiconductor structure after additional processing operations according to one or more embodiments of the invention.

FIG. 4 depicts a cross-sectional view of the semiconductor structure 200 after a processing operation according to one or more embodiments of the invention. In some embodiments of the invention, an outer layer 402 is formed over the inner layer 302. In some embodiments of the invention, the outer layer 402 is formed to a thickness (height) of 3 nm or more, for example 7 nm to 70 nm, although other thicknesses are within the contemplated scope of the invention.

The outer layer 402 can be epitaxially grown on exposed surfaces of the inner layer 302 using, for example, VPE, MBE, LPE, or other suitable processes. In this manner, the outer layer 402 can be conformally formed over the inner layer 302. The outer layer 402 can be epitaxially grown from gaseous or liquid precursors and doped (in-situ or otherwise) in a similar manner as the inner layer 302. Doping and composition of the outer layer 402 is optimized for achieving a low contact electrical resistivity and a suitable bulk electrical conductivity for allowing electrical current into inner layer 302 without any current crowding effects. Doping requirements for the outer layer 402 are different than those for inner layer 302. A certain degree of dopant precipitation and clusterization is permissible in the outer layer 402 if it improves contact resistivity and does not degrade its bulk conductivity too much. Accordingly, the dopant concentration in the doped regions 402 can range from $1\times10^{20}$ cm$^{-3}$ to $3\times10^{21}$ cm$^{-3}$, or between $1\times10^{21}$ cm$^{-3}$ and $2\times10^{21}$ cm$^{-3}$. However, forming a heavily doped, conformal outer layer 402 early in the process fabrication flow is challenging for stacked nanosheets devices because of nanosheet stack height, close proximity to the channel, and inability to use deep implants due to excessive lateral dopant straggle.

In some embodiments of the invention, the nanosheets 202 are silicon nanosheets (nFETs) and the outer layer 402 is made of n-type doped silicon germanium, germanium, and/or tin alloys (e.g., SiGe:P, Ge:P, GeSn:P, or SiGeSn:P). In some embodiments of the invention, the outer layer 402 is heavily doped with n-type dopant, for example, with phosphorous. In some embodiments of the invention, the tin (Sn) atomic concentration in Group IV-tin alloys is about 5 to about 35 percent (e.g., the outer layer 402 can be SiGeSn25%). Forming the outer layer 402 in this manner will ensure that the melting point of the outer layer 402 (T3) will be less than the melting point of the inner layer 302 (T2) (i.e., T3<T2≤T1).

In some embodiments of the invention, the nanosheets 202 are silicon germanium nanosheets (pFETs) and the outer layer 402 is made of silicon germanium having a higher germanium content than the nanosheets 202 and the inner layer 302. For example, the nanosheets 202 can be made of SiGe20, the inner layer 302 can be made of SiGe30, and the outer layer 402 can be made of SiGe60. Forming the outer layer 402 in this manner will ensure that the melting point of the outer layer 402 (T3) will be less than the melting point of the inner layer 302 (T2) (i.e., T3<T2≤T1).

In some embodiments of the invention, the outer layer 402 can be made of silicon germanium having a range of about 30 (SiGe30) to about 100 percent (pure Ge), or a range of about 40 (SiGe40) to about 80 percent (SiGe80), although other germanium concentrations are within the contemplated scope of the invention. In some embodiments of the invention, the outer layer 402 is formed from silicon germanium having less than or equal to about 80 percent germanium to avoid any thermal degradation caused by a subsequent RMG process. In some embodiments of the invention, the outer layer 402 is formed from silicon germanium tin SiGeSn alloy having less than or equal to about 35% Sn. In some embodiments of the invention, the material of the outer layer 402 is selected to ensure that the melting point of the outer layer 402 (T3) is greater than the RMG thermal budget (e.g., 950 C), for example, about 1100 Celsius, although other temperatures are within the contemplated scope of the invention. Forming the outer layer 402 from a material having a melting point higher than the RMG thermal budget ensures that the outer layer 402 does not melt prematurely and uncontrollably (prior to implantation, as discussed with respect to FIG. 6) during the RMG module. It should be appreciated that this restriction puts a limit on how much Ge and/or tin (Sn) can be incorporated into the outer layer 402 at this step.

In some embodiments of the invention, the outer layers 402 for respective nFET and pFET devices are grown sequentially together with the respective inner layers 302. In some embodiments of the invention, a common outer layer 402 can be grown on formed n-type (nFETs) and p-type (pFETs) inner layers 302. If a common outer layer 402 is used, it is deposited undoped or lightly doped with a common n-type or p-type dopant of low concentration, e.g. from between $1 \times 10^{17}$ cm$^{-3}$ and $3 \times 10^{19}$ cm$^{-3}$. The dopants from the respective nFET and pFET inner layers 302 will then diffuse during subsequent high-temperature steps into the respective nFET and pFET outers layers 402 making them n-type and p-type, respectively.

Figure 5:
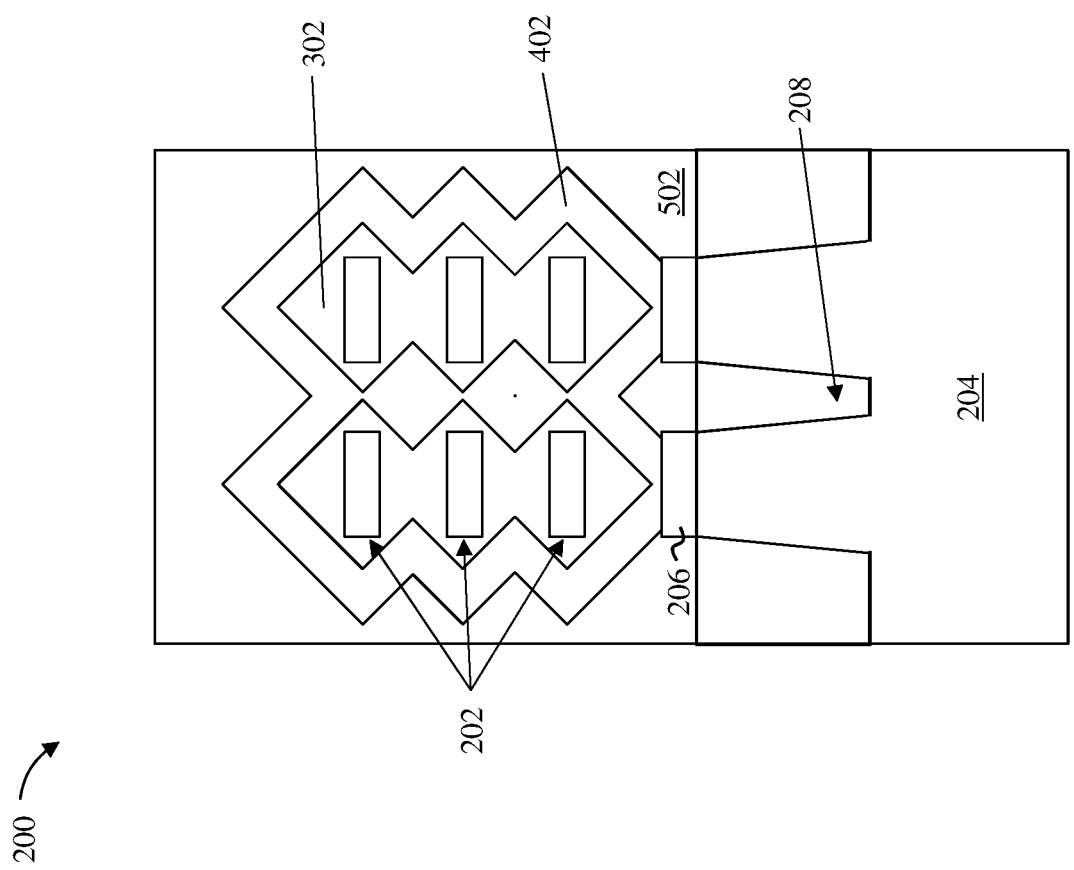
FIG. 5 depicts a cross-sectional view of the semiconductor structure after additional processing operations according to one or more embodiments of the invention.

FIG. 5 depicts a cross-sectional view of the semiconductor structure 200 after a processing operation according to one or more embodiments of the invention. In some embodiments of the invention, an interlayer dielectric 502 can be formed over the semiconductor structure 200. The interlayer dielectric 502 can be made of any suitable dielectric material, such as, for example, porous silicates, carbon doped oxides, silicon dioxides, silicon nitrides, silicon oxynitrides, or other dielectric materials. Any known manner of forming the interlayer dielectric 502 can be utilized, such as, for example, CVD, PECVD, ALD, flowable CVD, spin-on dielectrics, or PVD. In some embodiments of the invention, the interlayer dielectric 502 and the shallow trench isolation region 208 are made of the same dielectric material, and together define a single continuous dielectric region.

Figure 6:
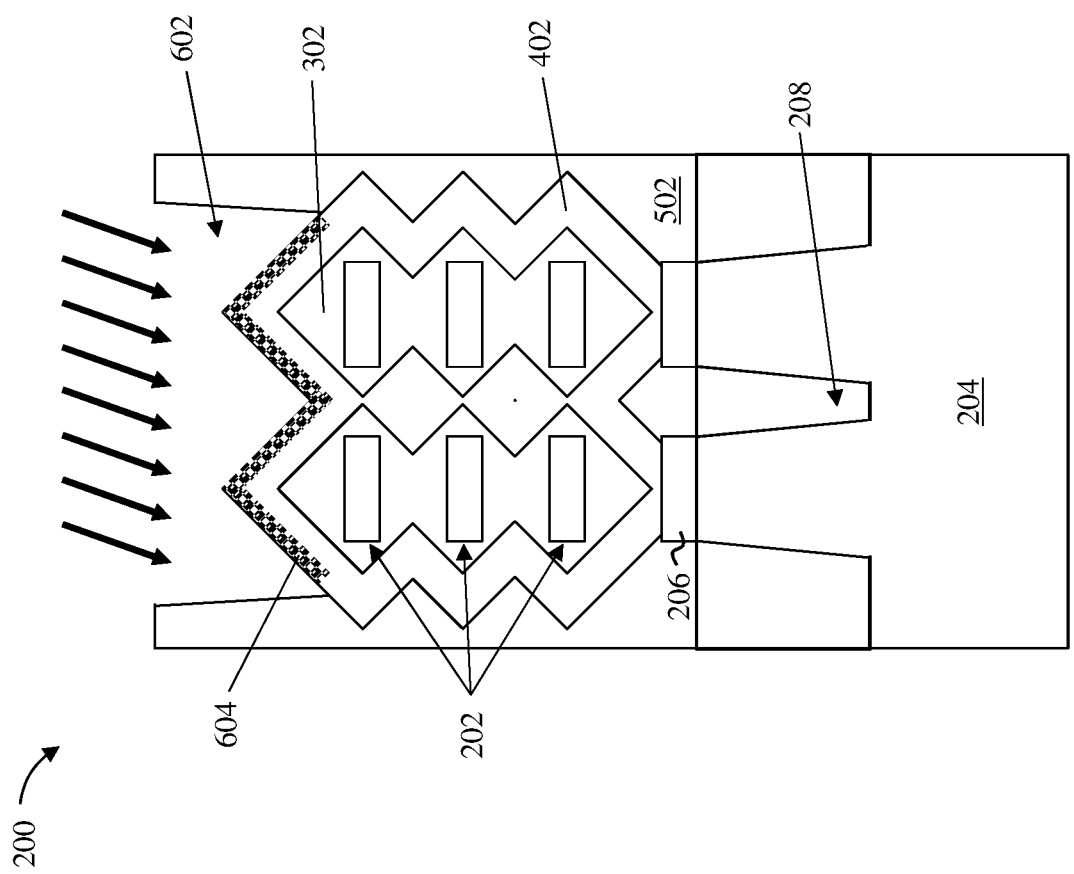
FIG. 6 depicts a cross-sectional view of the semiconductor structure after additional processing operations according to one or more embodiments of the invention.

FIG. 6 depicts a cross-sectional view of the semiconductor structure 200 after a processing operation according to one or more embodiments of the invention. In some embodiments of the invention, portions of the interlayer dielectric 502 are removed to form a trench 602. The trench 602 exposes a top surface of the outer layer 402. Portions of the interlayer dielectric 502 can be removed using, for example, a wet etch, a dry etch, a RIE or a combination of wet, ME, and/or dry etches. In some embodiments of the invention, portions of the interlayer dielectric 502 are removed selective to the outer layer 402.

In some embodiments of the invention, the trench 602 is formed after completing the RMG process. In other words, the trench 602 can be formed after the sacrificial gates are removed and replaced with conductive gates (not shown). The RMG process can include a high temperature process that can exceed 900 Celsius. As will be discussed further herein, forming a low contract resistivity region in the trench 602 after gate replacement ensures that the low contract resistivity and high electrical conductivity regions are protected from the thermal degradation which would result due to the high temperatures associated with the RMG process.

As further shown in FIG. 6, a heavily doped surface region 604 is formed on the exposed top surface of the outer layer 402. In some embodiments of the invention, the heavily doped surface region 604 is formed using a shallow ion implantation. The heavily doped surface region 604 can include n-type or p-type dopants, depending on the desired final device. The dopant concentration can exceed $1 \times 10^{21}$ cm$^{-3}$ (equivalent to approximately 2 to 3 atomic percent). In some embodiments of the invention, the dopant concentration ranges from 2 atomic percent to 20 atomic percent, for example 30 atomic percent, although other dopant concentrations are within the contemplated scope of the invention. In some embodiments of the invention, the dopants penetrate the surface of the outer layer 402 during the ion implantation, and the depth to which the dopants implant defines the heavily doped surface region 604.

Figure 7:
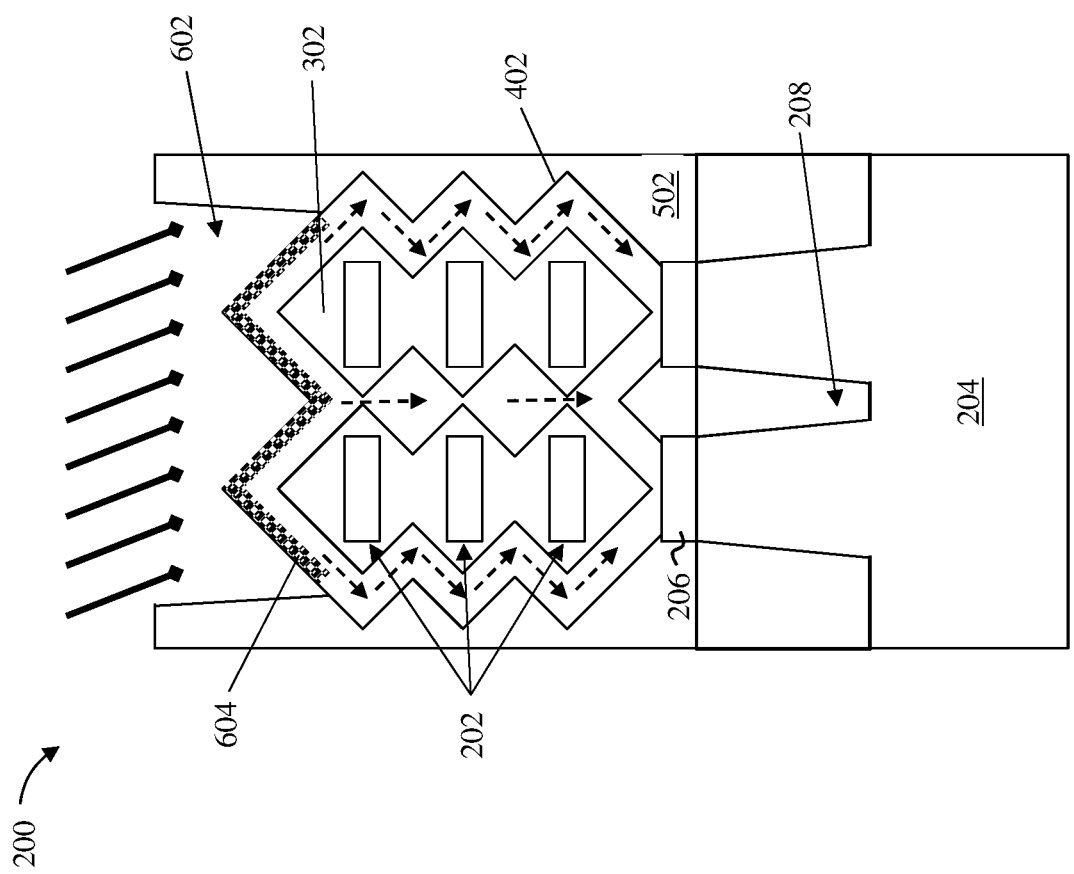
FIG. 7 depicts a cross-sectional view of the semiconductor structure after additional processing operations according to one or more embodiments of the invention.

FIG. 7 depicts a cross-sectional view of the semiconductor structure 200 after a processing operation according to one or more embodiments of the invention. As shown in FIG. 7, the semiconductor structure 200 is melt annealed to distribute the dopants in the heavily doped surface region 604 throughout the entirety of the outer layer 402 without affecting diffusion of dopants in inner region 302 and/or the nanosheets 202.

In some embodiments of the invention, the annealing process is configured to liquify the outer layer 402. In some embodiments of the invention, the annealing process is a nanosecond laser anneal tuned to melt (liquify) the outer layer 402 but not the inner layer 302 and/or nanosheet stack 202. As discussed previously herein, the inner layer 302 and the outer layer 402 can be formed from materials having melting points T2 and T3 respectively, where T3 is less than T2. This melting point difference allows for the outer layer 402 to be selectively melted without liquifying the inner layer 302. In some embodiments of the invention, the nanosecond laser anneal occurs for a duration of about 100 nanoseconds at a temperature that is greater than T3, but less than T2, although other durations and temperatures are within the contemplated scope of the invention. In some embodiments of the invention, longer anneal durations can be achieved by conducting shorter anneals multiple times. For instance, 5 consecutive 100-nanosecond anneals can be used if 500-nanosecond anneal duration is desired.

Dopant diffusivity in the liquid phase outer layer 402 is about $10^9$ (a billion) times higher than in the solid phase. Consequently, dopants in the heavily doped surface region 604 distribute throughout the entirety of the liquid outer layer 402, defining a low resistivity epi surface region 802 (see FIG. 8) that encompasses the whole surface of the inner layer 302. Importantly, any dopants in solid layers 302 and 202 do not diffuse due to an ultra-short duration of the anneals. Depending on exact dopant and material 402, the anneal duration at above the melting point T3 can be selected to allow enough process time for the dopants of layer 604 to reach the bottom of nanosheet stack 202. In some embodiments of the invention, selecting appropriate cumulative anneal duration can be accomplished by conducting multiple consecutive short-duration anneals, as alluded above.

Once liquified, the liquid material has the potential to inadvertently migrate along all exposed surfaces (this process is known as wetting). In some embodiments of the invention, the material of the interlayer dielectric 502 is selected such that the surface of the interlayer dielectric 502 is not wettable by the liquid phase outer layer 402. This prevents migration of liquid material up sidewalls of the interlayer dielectric 502. For example, SiO$_2$ is not wettable by the liquid phase outer layer 402. Alternatively, the liquid phase of outer layer 402 can be kept in place by a sacrificial capping material (not shown) that may be formed over implanted layer 604 prior to melt annealing and selectively removed afterward.

After redistributing dopants throughout the liquid phase of outer layer 402, the semiconductor structure 200 is quenched to prevent excess dopant precipitation and clusterization and further dopant migration. Quenching causes the liquid layer 402 to undergo a rapid solidification and a quick cooling of resultant solid phase such that the dopants in the resultant solid phase cannot migrate to their nearest neighbor, thus, preventing agglomeration of dopants into clusters and precipitates. The speed of quenching is related to the anneal duration, longer anneals have a lower speed of quenching, and is around $10^{10}$ (ten billion) degrees/second for 100-nsec anneals. Because a high speed of quenching is desired, it is more advantageous to conduct several consecutive shorter anneals, each having a high speed of quenching, than a single longer anneal with an equivalent duration but with a lower speed of quenching. Fast quenching produces a metastable heavily-doped semiconductor alloy with homogeneous doping. It is schematically shown in FIG. 8 as layer 802.

Figure 8:
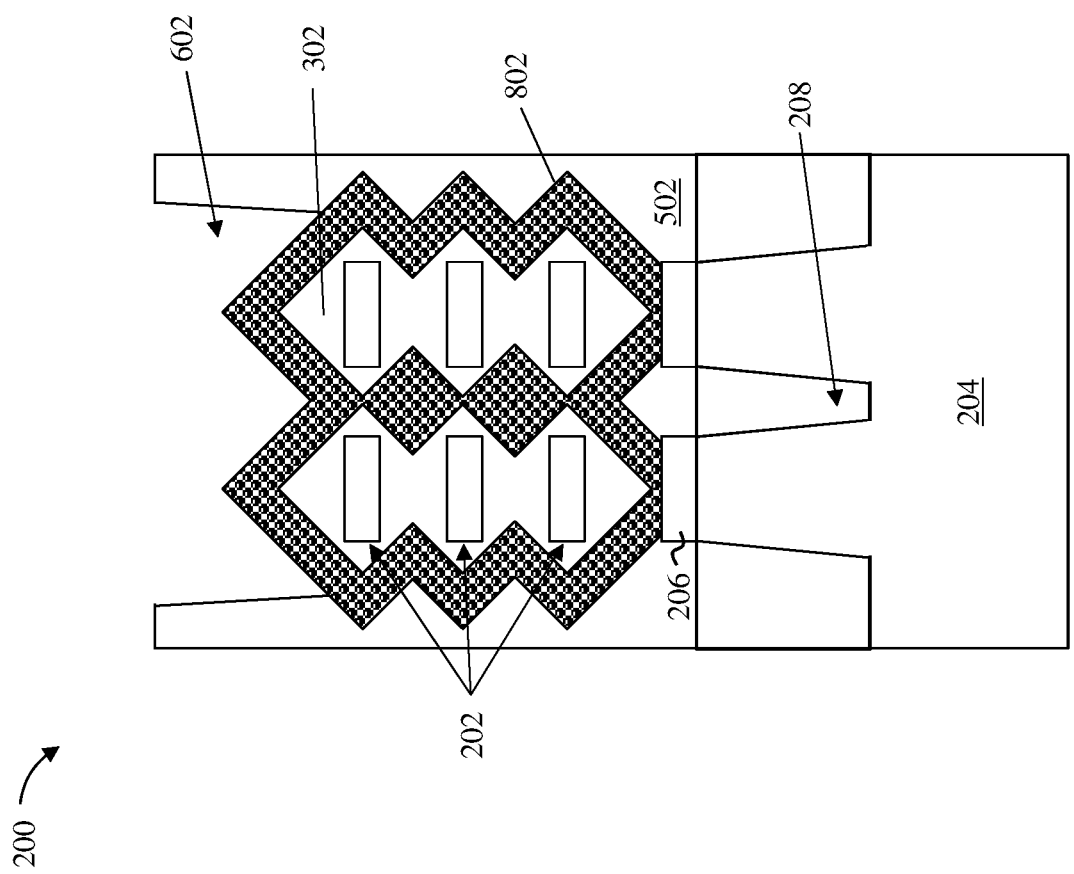
FIG. 8 depicts a cross-sectional view of the semiconductor structure after additional processing operations according to one or more embodiments of the invention.

FIG. 8 depicts a cross-sectional view of the semiconductor structure 200 after a processing operation according to one or more embodiments of the invention. As shown in FIG. 8, the heavily doped surface region 604 (shown in FIG. 7) has been distributed throughout the entirety of the outer layer 402 (shown in FIG. 7). The resulting heavily-doped low resistivity epi surface region 802 encompasses the whole surface of the inner layer 302, providing a low contact and epitaxy resistivities that are not limited to the line-of-sight interfacial area between the source/drain and the contact (as shown in FIGS. 1A and 1B).

The atomic percent or concentration of dopants in the resultant heavily doped layer 802 is approximately 2 to 3 times less than the concentration of dopant in the starting surface layer 604 but still exceeds the dopant solid solubility limit in material 402 and is typically higher than about $1\times10^{21}$ cm$^{-3}$. Finally, while not shown for ease of discussion, the entire implantation, anneal, quench process can be repeated any number of times to further increase the dopant concentration distributed throughout the low resistivity epi surface region 802. The resultant dopant-semiconductor metastable alloy of the outer layer 802 enables a low film resistivity and a low contact resistivity between layers 802 and 302 (unipolar semiconductor-semiconductor junction) and between layer 802 and metallic contact structure 902 (see FIG. 9). In some embodiments of the invention, the electrical resistivity of layer 802 is equal to or lower than $1.5\times10^{-4}$ Ωcm or, equivalently, approaching that of metallic films. By way of comparison, the electrical resistivity of a typical epitaxially grown, doped and annealed semiconductor films is $4\times10^{-4}$ Ωcm and that of metallic films such as Ti, TiN, or TiSi$_2$ is $0.5-1.5\times10^{-4}$ Ωcm. In some embodiments of the invention, the contact resistivity between layers 802 and 302 is equal to or lower than $2\times10^{-10}$ Ωcm$^2$.

Figure 9:
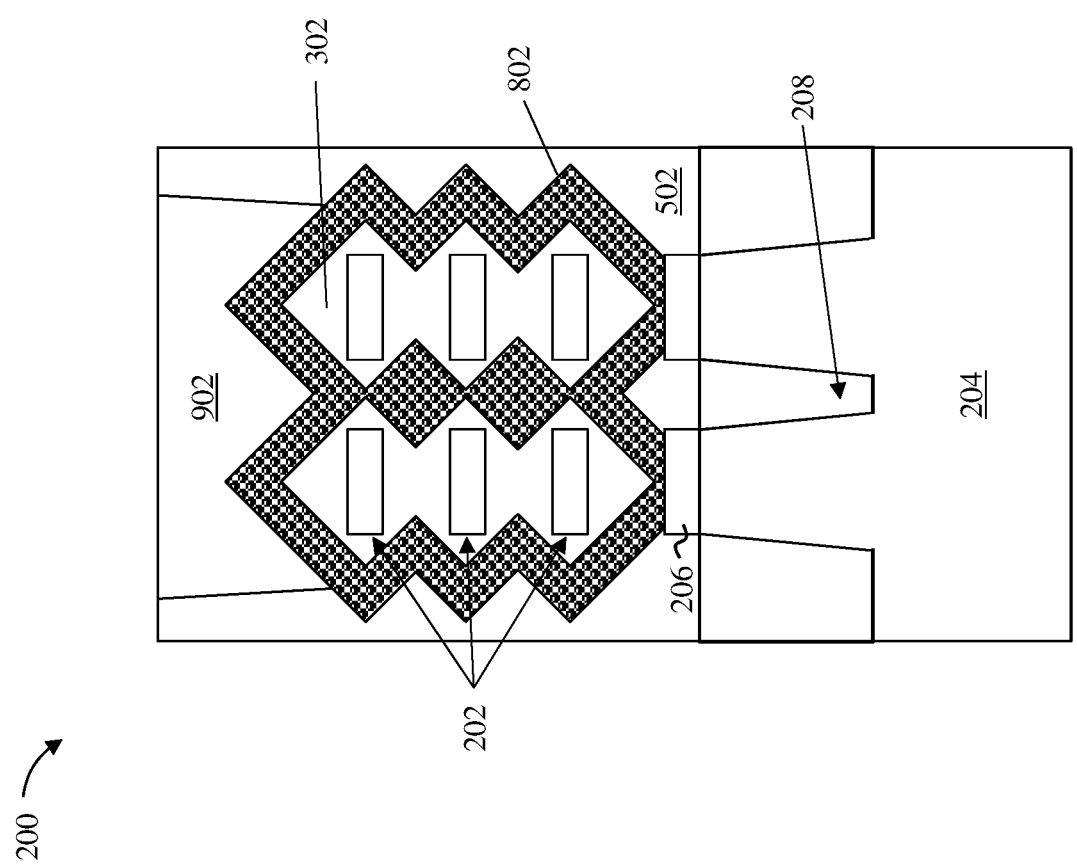
FIG. 9 depicts a cross-sectional view of the semiconductor structure after additional processing operations according to one or more embodiments of the invention.

FIG. 9 depicts a cross-sectional view of the semiconductor structure 200 after a processing operation according to one or more embodiments of the invention. As shown in FIG. 9, a contact structure 902 can be formed by depositing or forming a conductive material into the trench 602. In this manner, the electrical contact between the structure 902 and the layer 802 can be formed on a surface of the low resistivity epi surface region 802.

The contact 902 can be formed or deposited using known metallization techniques. In some embodiments of the invention, the exposed surface of region 802 is cleaned to remove any residual dielectric or poorly conducting films such as native oxides and the trench 602 is filled with conductive material. In some embodiments of the invention, the contact 902 is overfilled above a surface of the trench 602, forming an overburden that is removed using, for example, CMP. The contact structure 902 can be annealed with a low thermal budget process to initiate a surface reaction between a conductive material directly adjacent to region 802 and the semiconductor-dopant alloy of region 802. The surface reaction produces a thin layer (e.g. 1-5 nm thick) of metallic compound such as metal silicide and/or germanide. The thermal budget of such contact anneal is chosen to be low enough to preserve the metastable semiconductor-dopant alloy of region 802. In some embodiments of the invention, the contact anneal is an 800 C millisecond-scale anneal with the duration above 750 C of about 100 microseconds. While not shown for ease of illustration, additional contacts (e.g., gate contacts) can be similarly formed in the semiconductor structure 200 using known fabrication workflows.

The contact 902 (and any other contacts) can be made of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium silicide, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the contact 902 is a cobalt or tungsten contact. The conductive material can further include dopants that are incorporated during or after deposition. In some embodiments of the invention, the contact 902 can include a reactive metal and a barrier metal liner (not depicted). Material examples include titanium and titanium nitride (Ti/TiN), tantalum nitride and tantalum (TaN/Ta), nickel and titanium nitride (Ni/TiN), titanium, titanium nitride, cobalt, ruthenium, rhodium, and manganese. The reactive metal may form an interfacial layer with region 802 made out of metal-semiconductor metallic compound such as metal silicide or germanide. For instance, if reactive metal is titanium, a titanium silicide and/or titanium germanide is included into the contact structure 902 and located directly adjacent to the region 802.

The metastable semiconductor-dopant alloy of region 802 enables a low contact resistivity between the contact structure 902 and the region 802 thus reducing the nanosheet transistor series resistance. In some embodiments of the invention, the contact resistivity between the region 802 and the contact structure 902 is equal to or lower than $1\times10^{-9}$ Ωcm$^2$. The contact resistivity of any interfaces between different metallic compounds that may be present in the contact structure 902 is less than $1\times10^{-10}$ Ωcm$^2$ and is small in comparison to the contact resistivity of the interface between 902 and 802. A low contact resistivity between contact 902 and region 802, a low film resistivity of region 802, and a very low contact resistivity between region 802 and region 302 allows for an unobstructed electrical current flow from the contact 902 into the region 802, through the region 802, into the region 302, and, eventually, into the nanosheet channels 202.

FIGS. 10 to 14 represent an alternative embodiment (a WAC process flow) to FIGS. 1-9 (a non-WAC process flow) for forming a low resistivity semiconductor-metal contact region that encompasses the whole surface of the main epitaxially grown layer.

Figure 10:
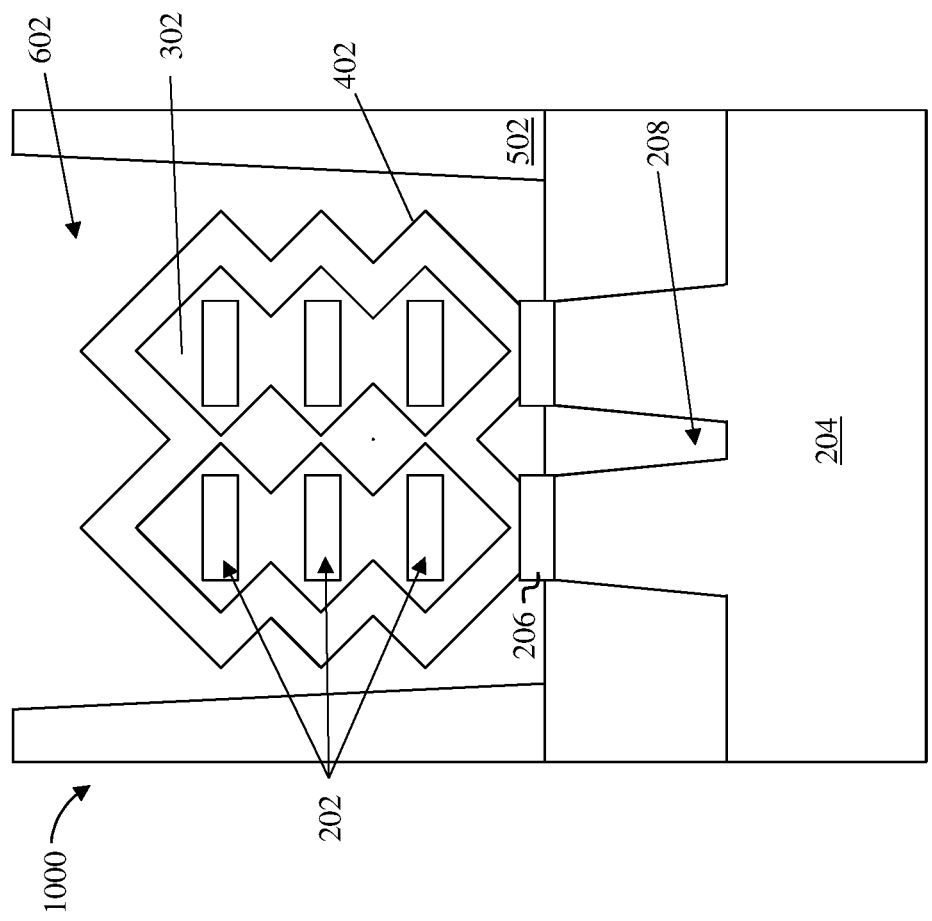
FIG. 10 depicts a cross-sectional view of a semiconductor structure after alternative processing operations according to one or more embodiments of the invention.

FIG. 10 depicts a cross-sectional view of a semiconductor structure 1000 after an initial set of fabrication operations have been applied as part of a method of fabricating a final semiconductor device according to one or more embodiments of the invention. The final semiconductor device can be a variety of types of MOSFETs, including, for example, n-type nanosheet field effect transistors (NS NFETs) and p-type field nanosheet field effect transistors (NS PFETs). The semiconductor structure 1000 can be initially formed in a similar manner as the semiconductor structure 200.

As shown in FIG. 10, the interlayer dielectric 502 is recessed over a wider contact area and below a top surface of the bottom isolation structure 206 to form a wider contact trench 602 and to expose the sidewalls of the outer layer 402. In some embodiments of the invention, the interlayer dielectric 502 is recessed after the events depicted previously herein with respect to FIG. 5. In this manner, sidewalls of the outer layer 402 can be exposed. In other embodiments of the invention, the outer layer 402 is formed after recessing the interlayer dielectric 502 and exposing the sidewalls of the inner layer 302. In this case, the interlayer dielectric 502 is deposited after the events depicted previously herein with respect to FIG. 3 and its recess is performed after completing the RMG process module. The outer layer 402 is formed within the contact trenches 602 and on the exposed surfaces of inner layer 302 in a similar manner described previously herein with respect to FIG. 4. The advantage of forming outer layer 402 in the contact trenches 602 and after completing the RMG process module is that the melting point T3 of material 402 is no longer limited by the RMG thermal steps. Accordingly, there is no an RMG-defined limit on how much Ge and/or tin (Sn) can be incorporated into the outer layer 402.

Figure 11:
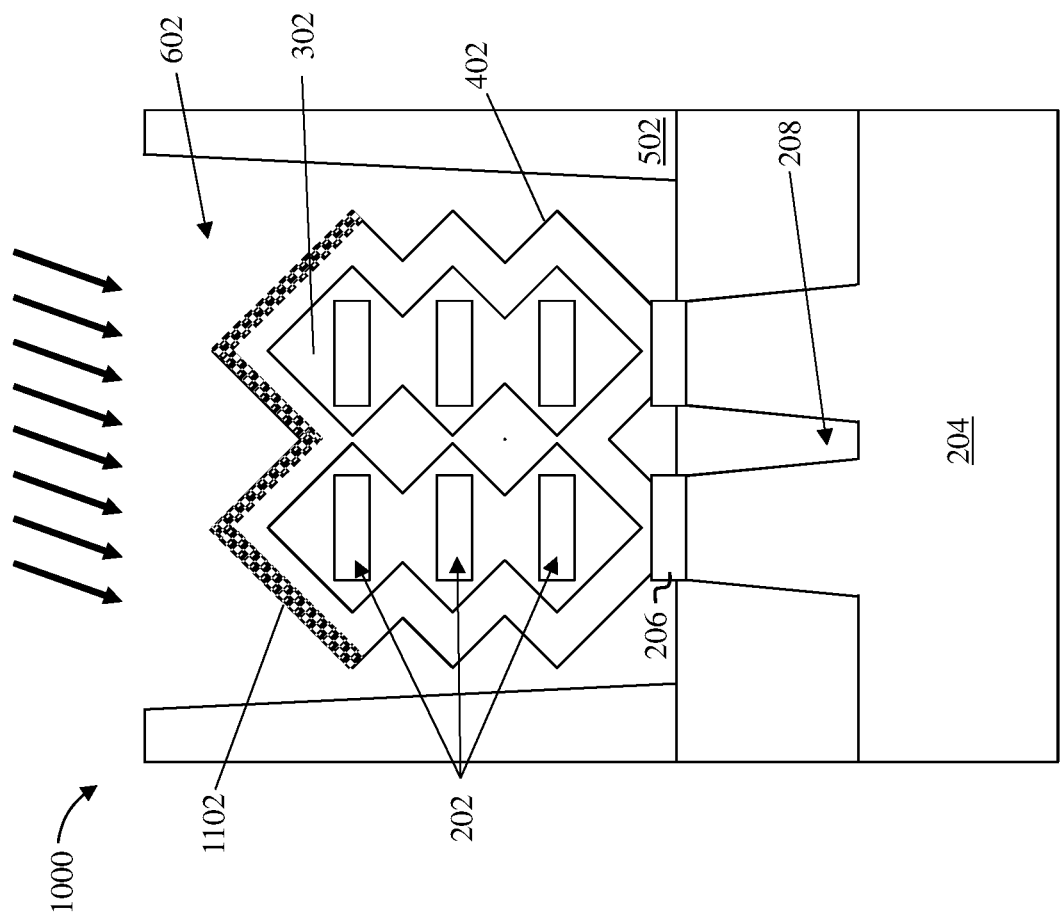
FIG. 11 depicts a cross-sectional view of the semiconductor structure after additional processing operations according to one or more embodiments of the invention.

FIG. 11 depicts a cross-sectional view of the semiconductor structure 1000 after a processing operation according to one or more embodiments of the invention. As shown in FIG. 11, a heavily doped surface region 1102 is formed on the exposed top surface of the outer layer 402. In some embodiments of the invention, the heavily doped surface region 1102 is formed using a shallow ion implantation, in a similar manner as the heavily doped surface region 604 (FIG. 6). In some embodiments of the invention, the heavily doped surface region 1102 is also formed on the exposed sidewall surfaces of the outer layer 402 (not shown) using an angled shallow ion implantation or plasma doping.

The heavily doped surface region 1102 can include n-type or p-type dopants, depending on the desired final device. The dopant concentration can exceed $10^{21}$ cm$^{-3}$ (equivalent to approximately 2 to 3 atomic percent). In some embodiments of the invention, the dopant concentration ranges from 2 atomic percent to 20 atomic percent, for example 30 atomic percent, although other dopant concentrations are within the contemplated scope of the invention. In some embodiments of the invention, the dopants penetrate the surface of the outer layer 402 during the ion implantation, and the depth to which the dopants implant defines the heavily doped surface region 1102.

Figure 12:
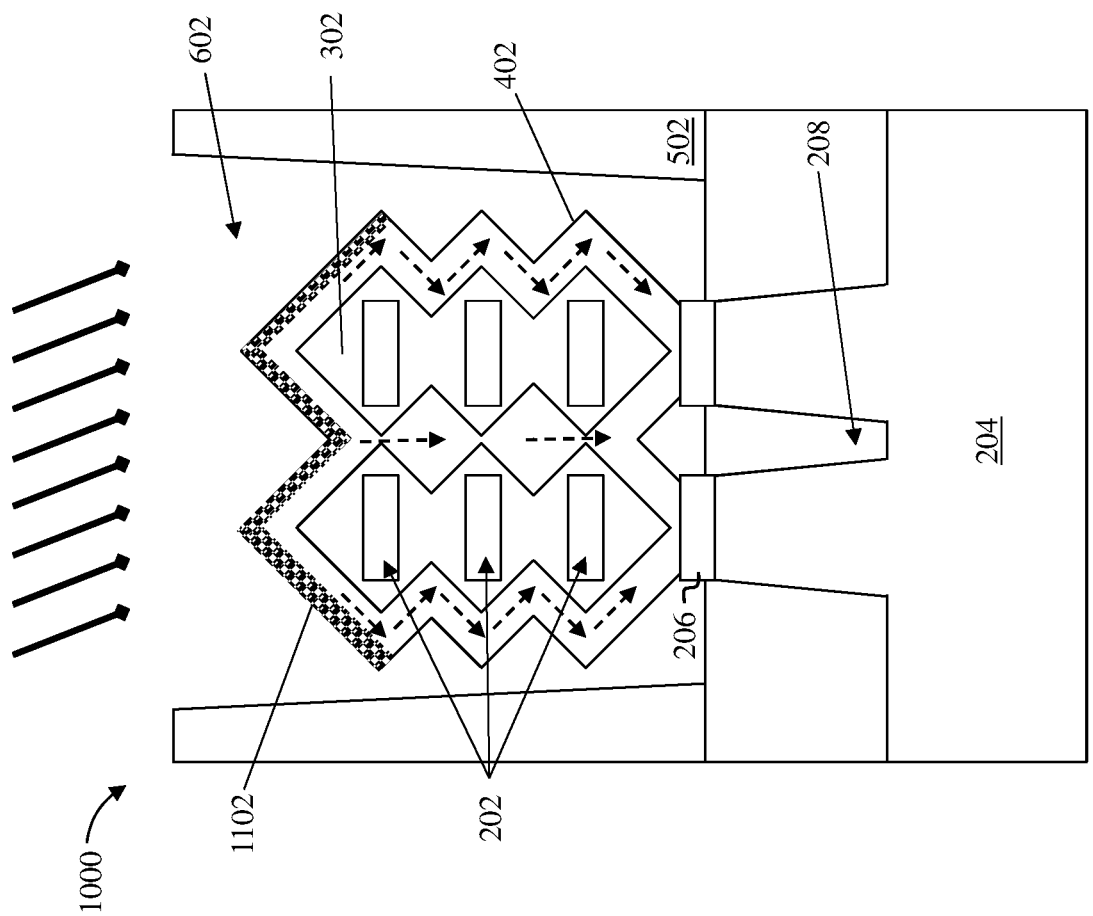
FIG. 12 depicts a cross-sectional view of the semiconductor structure after additional processing operations according to one or more embodiments of the invention.

FIG. 12 depicts a cross-sectional view of the semiconductor structure 1000 after a processing operation according to one or more embodiments of the invention. As shown in FIG. 12, the semiconductor structure 1000 is melt annealed to distribute the dopants in the heavily doped surface region 1102 throughout the entirety of the outer layer 402, in a similar manner as discussed with respect to the heavily doped surface region 604 (FIG. 7) and without affecting diffusion of dopants in inner region 302 and/or the nanosheets 202.

As discussed previously herein, dopant diffusivity in the liquid phase outer layer 402 is about $10^9$ (a billion) times higher than in the solid phase. Consequently, dopants in the heavily doped surface region 1102 distribute throughout the entirety of the liquid outer layer 402, defining a low resistivity epi surface region 1302 (see FIG. 13) that encompasses the whole surface of the inner layer 302. Importantly, any dopants in solid layers 302 and 202 do not diffuse due to an ultra-short duration of the anneals.

Once liquified, the liquid material has the potential to inadvertently migrate along all exposed surfaces (this process is known as wetting). Accordingly, there must be a mechanism for keeping the liquid material of the outer layer 402 in place. In some embodiments of the invention, the materials of the bottom isolation dielectric 206 and the interlayer dielectric 502 are selected such that their surfaces facing and adjacent to the layer 402 are not wettable by the liquid phase outer layer 402. This prevents migration of liquid material keeping it around the solid inner layer 302. For example, $SiO_2$ is not wettable by the liquid phase outer layer 402 while the surface of the inner layer 302 is wettable by the liquid phase outer layer 402. In this case, the surface tension forces will keep the liquid material of the outer layer 402 in place without any additional supporting structure. Alternatively, the liquid phase of outer layer 402 can be kept in place by a sacrificial capping material (not shown) that may be formed over implanted region 1102 and the outer layer 402 prior to melt annealing and selectively removed afterward.

Figure 13:
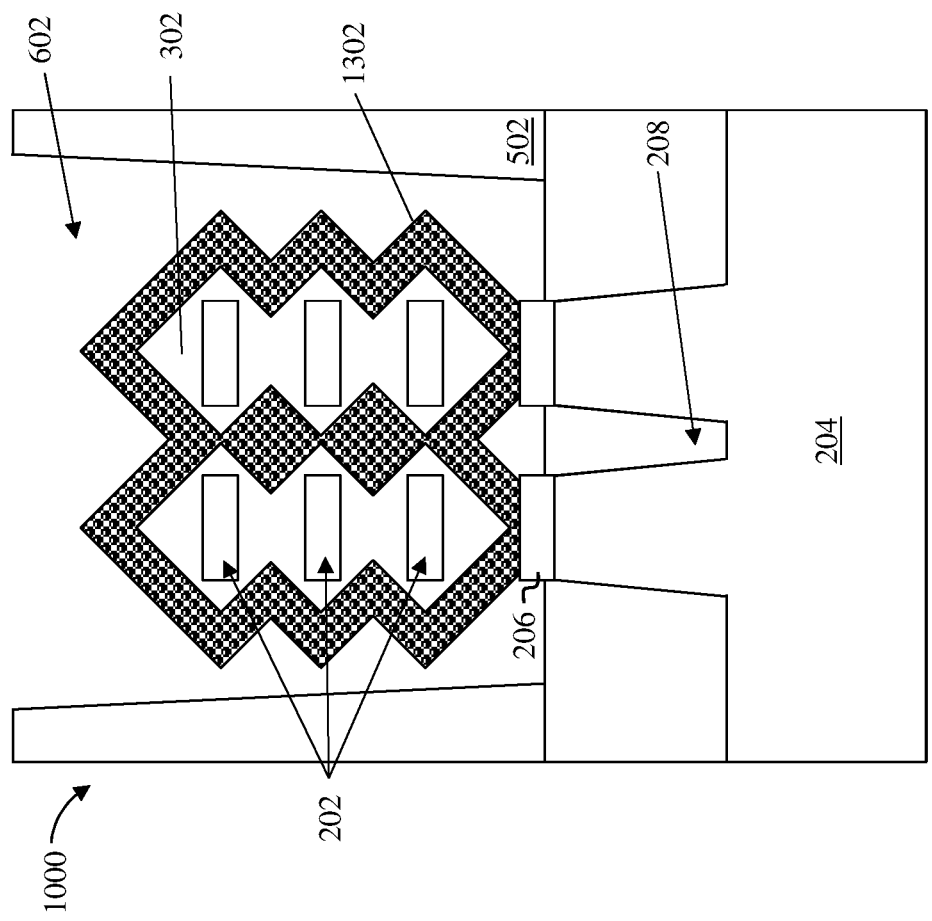
FIG. 13 depicts a cross-sectional view of the semiconductor structure after additional processing operations according to one or more embodiments of the invention.

FIG. 13 depicts a cross-sectional view of the semiconductor structure 1000 after a processing operation according to one or more embodiments of the invention. As shown in FIG. 13, the heavily doped surface region 1102 (shown in FIG. 12) has been distributed throughout the entirety of the liquid outer layer 402 (shown in FIG. 12). The resulting heavily-doped low resistivity epi surface region 1302 encompasses the whole surface of the inner layer 302, providing a low contact and epitaxy resistivities that are not limited to the line-of-sight interfacial area between the source/drain and the contact (as shown in FIGS. 1A and 1B).

After redistributing dopants throughout the liquid phase of outer layer 402, the semiconductor structure 1000 is quenched to prevent excess dopant precipitation and clusterization and further dopant migration. Quenching causes the liquid layer 402 to undergo a rapid solidification and a quick cooling of resultant solid phase such that the dopants in the resultant solid phase cannot migrate to their nearest neighbor, thus, preventing agglomeration of dopants into clusters and precipitates. The speed of quenching is related to the anneal duration, longer anneals have a lower speed of quenching, and is around $10^{10}$ (ten billion) degrees/second for 100-nsec anneals. Fast quenching produces a metastable heavily-doped semiconductor alloy with homogeneous doping. It is schematically shown in FIG. 13 as layer 1302.

Figure 14:
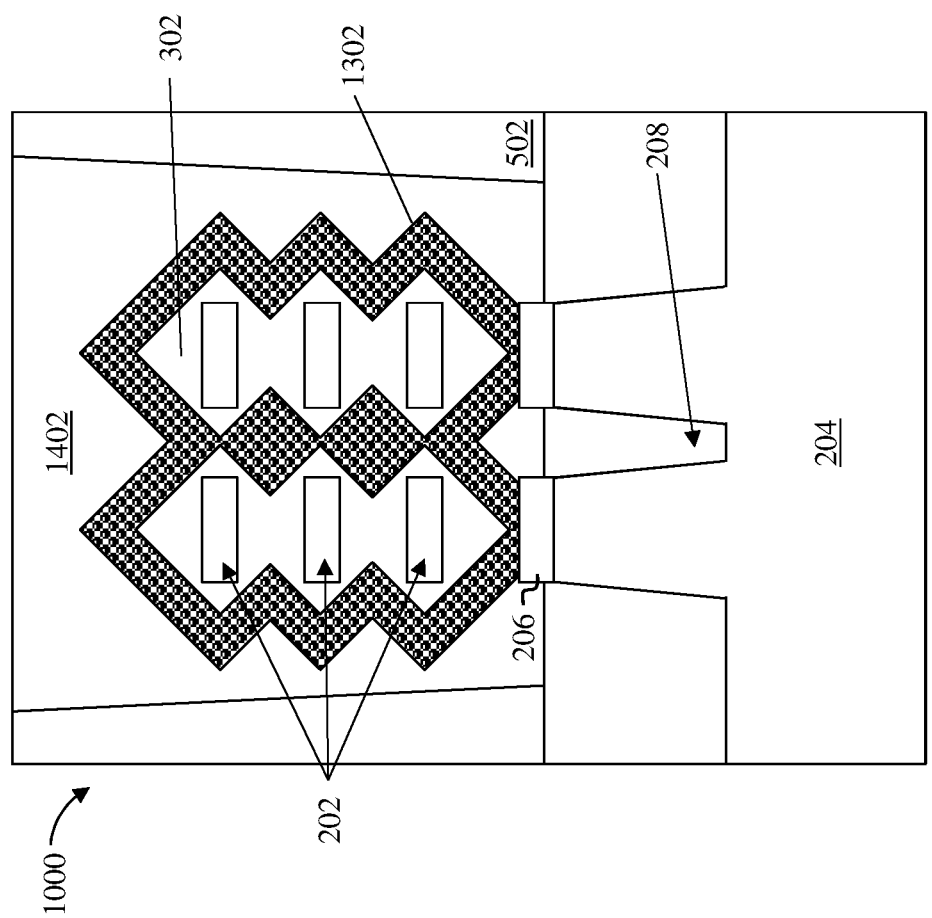
FIG. 14 depicts a cross-sectional view of the semiconductor structure after additional processing operations according to one or more embodiments of the invention.

FIG. 14 depicts a cross-sectional view of the semiconductor structure 1000 after a processing operation according to one or more embodiments of the invention. As shown in FIG. 14, a contact structure 1402 can be formed by depositing or forming a conductive material into the trench 602. In this manner, the electrical contact between the structure 1402 and the layer 1302 can be formed on a surface of the low resistivity epi surface region 1302. The contact structure 1402 can be formed of a similar material as the contact 902 (FIG. 9). Forming contact structure 1402 can be completed using known metallization techniques and process steps such as surface cleaning, barrier and metal deposition, CMP, and annealing, in similar ways as forming contact structure 902 (FIG. 9). However, the contact area encompasses the whole surface of the layer 1302 forming a wrap-around (WAC) structure with a low contact resistivity over the entire contact area. In addition, a low film resistivity of layer 1302 reduces electrical current crowding effects. In some embodiments of the invention, the contact resistivity between the region 1302 and the contact structure 1402 is equal to or lower than $1 \times 10^{-9}$ $\Omega cm^2$. In some embodiments of the invention, the electrical resistivity of layer 1302 is equal to or lower than $1.5 \times 10^{-4}$ $\Omega cm$ or, equivalently, approaching that of metallic films. In some embodiments of the invention, the contact resistivity between layers 1302 and 302 is equal to or lower than $2 \times 10^{-10}$ $\Omega cm^2$. A low contact resistivity and a large contact area between contact 1402 and region 1302, a low film resistivity of region 1302, and a very low contact resistivity between region 1302 and region 302 allows for an unobstructed electrical current flow from the contact 1402 into the region 1302, through the region 1302, into the region 302, and, eventually, into the nanosheet channels 202.

Figure 15:
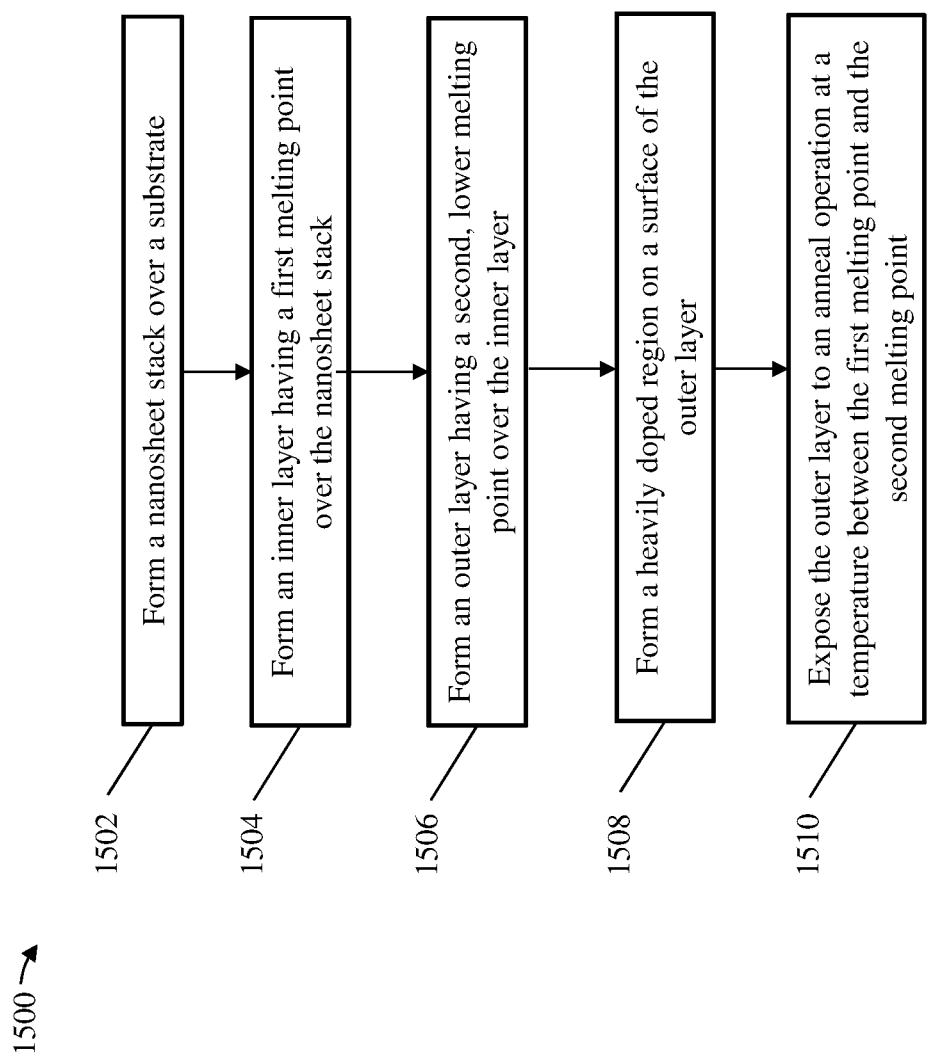
FIG. 15 depicts a flow diagram illustrating a method according to one or more embodiments of the invention.

FIG. 15 depicts a flow diagram 1500 illustrating a method for forming a semiconductor device according to one or more embodiments of the invention. As shown at block 1502, a nanosheet stack is formed over a substrate. The nanosheet stack can include one or more nanosheets.

At block 1504, an inner layer is formed over the nanosheets. The inner layer can include a first material having a first melting point.

At block 1506, an outer layer is formed over the inner layer. The outer layer can include a second material having a second melting point that is lower than the first melting point.

At block 1508, a heavily doped region is formed on a surface of the outer layer. In some embodiments of the invention, forming the heavily doped region includes forming an interlayer dielectric over the outer layer, removing a portion of the interlayer dielectric to expose a surface of the outer layer, and depositing dopants into the exposed surface of the outer layer.

At block 1510, the semiconductor device is annealed at a temperature between the first melting point and the second melting point such that the outer layer is selectively liquified. In some embodiments of the invention, annealing includes a nanosecond laser anneal. In some embodiments of the invention, the nanosecond laser anneal occurs for about 100 nanoseconds. In some embodiments of the invention, liquifying the outer layer causes dopants in the heavily doped region to distribute throughout the liquid outer layer.

The method can further include forming a bottom isolation region between the nanosheet stack and the substrate and/or forming a wrap-around contact that envelops the outer layer.

FIG. 16 depicts a flow diagram 1600 illustrating a method for forming a semiconductor device according to one or more embodiments of the invention. As shown at block 1602, one or more vertically stacked nanosheets are formed over a substrate. The nanosheets can include a first material having a first melting point.

At block 1604, an inner layer is formed over the nanosheets. The inner layer can include a second material having a second melting point that is less than or equal to the first melting point.

At block 1606, an outer layer is formed over the inner layer. The outer layer can include a third material having a third melting point that is lower than the second melting point.

At block 1608, dopants are implanted into a surface of the outer layer. In some embodiments of the invention, dopants are implanted using ion implantation.

At block 1610, the outer layer is selectively liquefied to distribute the dopants throughout the outer layer. In some embodiments of the invention, selectively liquifying the outer layer includes exposing the outer layer to a nanosecond laser anneal at a temperature between the second melting point and the third melting point. In some embodiments of the invention, the nanosecond laser anneal occurs for about 100 nanoseconds.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention, epitaxial growth and/or deposition processes can be selective to forming on semiconductor surface, and may or may not deposit material on other exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a nanosheet stack over a substrate;
    forming an inner layer over the nanosheet stack, the inner layer comprising a first material having a first melting point;
    forming an outer layer over the inner layer, the outer layer comprising a second material having a second melting point that is lower than the first melting point;
    forming a heavily doped region on a surface of the outer layer; and
    exposing the outer layer to an anneal operation at a temperature between the first melting point and the second melting point such that the outer layer is selectively liquified.

2. The method of claim 1, wherein the anneal operation comprises a nanosecond laser anneal.

3. The method of claim 1, wherein a duration of the nanosecond laser anneal is about 100 nanoseconds.

4. The method of claim 1, wherein forming the heavily doped region further comprises forming an interlayer dielectric over the outer layer.

5. The method of claim 4, wherein forming the heavily doped region further comprises removing a portion of the interlayer dielectric to expose a surface of the outer layer.

6. The method of claim 5, wherein forming the heavily doped region further comprises depositing dopants into the exposed surface of the outer layer.

7. The method of claim 6, wherein selectively liquifying the outer layer causes dopants in the heavily doped region to distribute throughout the outer layer.

8. The method of claim 1, wherein the second material comprises a Group-IV tin alloy.

9. The method of claim 6 further comprising recessing the interlayer dielectric to expose sidewalls of the outer layer.

10. The method of claim 9 further comprising forming a wrap-around contact that envelops the outer layer.

11. A method for forming a semiconductor device, the method comprising:
    forming a nanosheet stack over a substrate, the nanosheet stack comprising a first material having a first melting point;
    forming an inner layer over the nanosheet stack, the inner layer comprising a second material having a second melting point that is less than or equal to the first melting point;
    forming an outer layer over the inner layer, the outer layer comprising a third material having a third melting point that is lower than the second melting point;
    implanting dopants into a surface of the outer layer; and
    selectively liquifying the outer layer to distribute the dopants.

12. The method of claim 11, wherein selectively liquifying the outer layer comprises exposing the outer layer to a nanosecond laser anneal at a temperature between the second melting point and the third melting point.

13. The method of claim 12, wherein a duration of the nanosecond laser anneal is about 100 nanoseconds.

14. The method of claim 11 further comprising forming a wrap-around contact over the outer layer.

15. A semiconductor device comprising:
    one or more vertically stacked nanosheets over a substrate, the nanosheets comprising a first material having a first melting point;
    an inner layer over the nanosheets, the inner layer comprising a second material having a second melting point that is less than or equal to the first melting point; and
    an outer layer over the inner layer, the outer layer comprising dopants and a third material having a third melting point that is lower than the second melting point;
    wherein the outer layer is liquified and then quenched to evenly distribute the dopants.

16. The semiconductor device of claim 15, wherein the first material comprises silicon, the second material comprises doped silicon, and the third material comprises silicon germanium.

17. The semiconductor device of claim 16, wherein the third material comprises a Group-IV tin alloy.

18. The semiconductor device of claim 15, wherein the first material comprises silicon germanium having a first germanium concentration, the second material comprises silicon germanium having a second germanium concentration that is higher than the first germanium concentration, and the third material comprises silicon germanium having a third germanium concentration that is higher than the second germanium concentration.

19. The semiconductor device of claim 18, wherein the third germanium concentration ranges from about 60 atomic percent to about 100 atomic percent.

20. The semiconductor device of claim 15 further comprising a wrap-around contact formed over the outer layer.

* * * * *